(12) United States Patent
Kovar

(10) Patent No.: US 6,587,887 B1
(45) Date of Patent: Jul. 1, 2003

(54) DIGITAL DATA TRANSMISSION UTILIZING VECTOR COORDINATES WITHIN A HYPERBOLA MODEL

(76) Inventor: Brent Kovar, 121 6$^{th}$ St. East, Tierra Verde, FL (US) 33715

( * ) Notice: Subject to any disclaimer, the term of this patent is extended or adjusted under 35 U.S.C. 154(b) by 554 days.

(21) Appl. No.: 09/592,687

(22) Filed: Jun. 13, 2000

(51) Int. Cl.$^7$ .............................................. G06F 15/16
(52) U.S. Cl. .................................................... 709/245
(58) Field of Search ............................... 709/217, 245; 375/219, 220, 222, 340; 370/123, 464, 310

(56) References Cited

U.S. PATENT DOCUMENTS

| | | | | |
|---|---|---|---|---|
| 4,905,225 A | * | 2/1990 | Francois et al. | 370/60 |
| 5,184,346 A | * | 2/1993 | Kozaki et al. | 370/60 |
| 5,495,507 A | * | 2/1996 | Bellanger | 375/350 |
| 6,263,017 B1 | * | 7/2001 | Miller | 375/222 |

* cited by examiner

Primary Examiner—David Y Eng

(57) ABSTRACT

A system for increasing the transmission bandwidth of a terrestrial digital network is disclosed. In a first computer of the network a first data array is generated in memory. The first data array comprises the set of all possible binary patterns generated by the first computer. An identical data array is generated in the memory of a second computer coupled to the network. A data string corresponding to data to be transmitted from the first computer to the second computer is matched on the first data array of the first computer. Location information relating to the location of the data string in the first data array is generated. The location information is transmitted to the second computer along with transmission time information. The second computer reconstructs the array corresponding to the first array instance at the time of transmission and uses the location information to reconstruct the data pattern contained in the second array.

4 Claims, 8 Drawing Sheets

DIGITAL DATA TRANSMISSION UTILIZING VECTOR COORDINATES WITHIN A HYPERBOLA MODEL

FIELD OF THE INVENTION

The present invention relates generally to telecommunications, and more specifically increasing the throughput of digital data transmission over terrestrial networks.

BACKGROUND OF THE INVENTION

Data transmission over terrestrial networks is largely limited by the throughput of network interface devices and modems. The transmission of large files, such as graphics and audio files over the network involves the transmission of large amounts of data. With the advent of the World Wide Web, much data transmission over the Internet involves the transfer of large complex files that negatively impact the throughput of existing network systems. In certain cases, the latencies associated with network activity can be significant.

Although satellite communications and various wireless media are becoming more widely used for computer network systems, a large majority of network traffic is transmitted over hard-wired land lines, such as terrestrial telephone lines. Various compression algorithms have been developed to increase the bandwidth of such terrestrial media. Many of these solutions, however, are close reaching their theoretical maximum advantage due to physical limitations associated with these landlines (such as transmission effects in analog phone lines).

Other such solutions often require a modification of the protocol underlying the transmission system. Communication over the popular World Wide Web and the Internet relies upon the well-established TCP/IP (Transmission Control Protocol/Internet protocol) convention. Compression and data transmission techniques that require modification or extension of such protocols often involve widespread programming or implementation requirements. Such requirements often result in solutions that are not readily acceptable or that entail high cost and time requirements.

SUMMARY AND OBJECTS OF THE INVENTION

It is an object of embodiments of the present invention to increase the transmission rate of data transfers over terrestrial computer networks.

It is a further object of embodiments of the present invention to increase the bandwidth of present computer networks without changing the protocol integrity or base connection speed of the original transport medium.

It is yet a further object of embodiments of the present invention to provide a system for increasing the bandwidth of data transmission over the Internet through resident client-side and server-side software that utilizes the Internet protocol layer.

A system for increasing the transmission rate between client and server computers over a network is described. In one embodiment of the present invention, data is transmitted between receiving and transmitting computers as data indexes of synchronized dynamic tables located in the memory of the receiving and transmitting computers. The data structure can be any digital data in binary form. The dynamic tables are represented as a rotating matrix in the form of a ribbon with data entries that contain arrays of binary digits. The conversion process between the location of data and the data itself can be visualized as using a line passing across the plane of the ribbon. A block of data is represented by one or more sets of two points on the surface of the plane (vectors). Each pair of points defines a line passing through the plane from which a memory ribbon seizure can be derived from one plane (slice) or portion of a plane in the ribbon. The coordinates of the points on the ribbon are not saved directly, but are stored relative to the last set of points on the plane. Different vectors may represent differing amounts of data depending on where the line passes through the plane. The hyperbola model is the focus of a point whose difference in distances from two fixed points, or foci, is constant.

The receiving computer and the transmitting computer both contain identical copies of the rotating array matrix. Rotation of the ribbons is synchronized for data transmission.

Other features and advantages of the present invention will be apparent from the accompanying drawings and from detailed description that follows.

BRIEF DESCRIPTION OF THE DRAWINGS

The present invention is illustrated by way of example and not limitation in the figures of the accompanying drawings, in which like references indicate similar elements, and in which.

DESCRIPTION OF THE PREFERRED EMBODIMENTS

A system for increasing the bandwidth of digital terrestrial networks is described. In the following description, for purposes of explanation, numerous specific details are set forth in order to provide an understanding of the present invention. It will be evident, however, to those of ordinary skill in the art that the present invention may be practiced without the specific details. In other instances, well-known structures and devices are shown in block diagram form to facilitate explanation. The description of preferred embodiments is not intended to limit the scope of the claims appended hereto.

Aspects of the present invention may be implemented on one or more computers executing software instructions. According to one embodiment of the present invention, server and client computer systems transmit and receive data over a computer network or standard telephone line. The steps of accessing, downloading, and manipulating the data, as well as other aspects of the present invention are implemented by central processing units (CPU) in the server and client computers executing sequences of instructions stored in a memory. The memory may be a random access memory (RAM), read-only memory (ROM), a persistent store, such as a mass storage device, or any combination of these devices. Execution of the sequences of instructions causes the CPU to perform steps according to embodiments of the present invention.

The instructions may be loaded into the memory of the server or client computers from a storage device or from one or more other computer systems over a network connection. For example, a client computer may transmit a sequence of instructions to the server computer in response to a message transmitted to the client over a network by the server. As the server receives the instructions over the network connection, it stores the instructions in memory. The server may store the instructions for later execution, or it may execute the instructions as they arrive over the network connection. In some cases, the downloaded instructions may be directly supported by the CPU. In other cases, the instructions may not be directly executable by the CPU, and may instead be executed by an interpreter that interprets the instructions. In other embodiments, hardwired circuitry may be used in place of, or in combination with, software instructions to implement the present invention. Thus, the present invention is not limited to any specific combination of hardware circuitry and software, nor to any particular source for the instructions executed by the server or client computers.

Figure 1A:
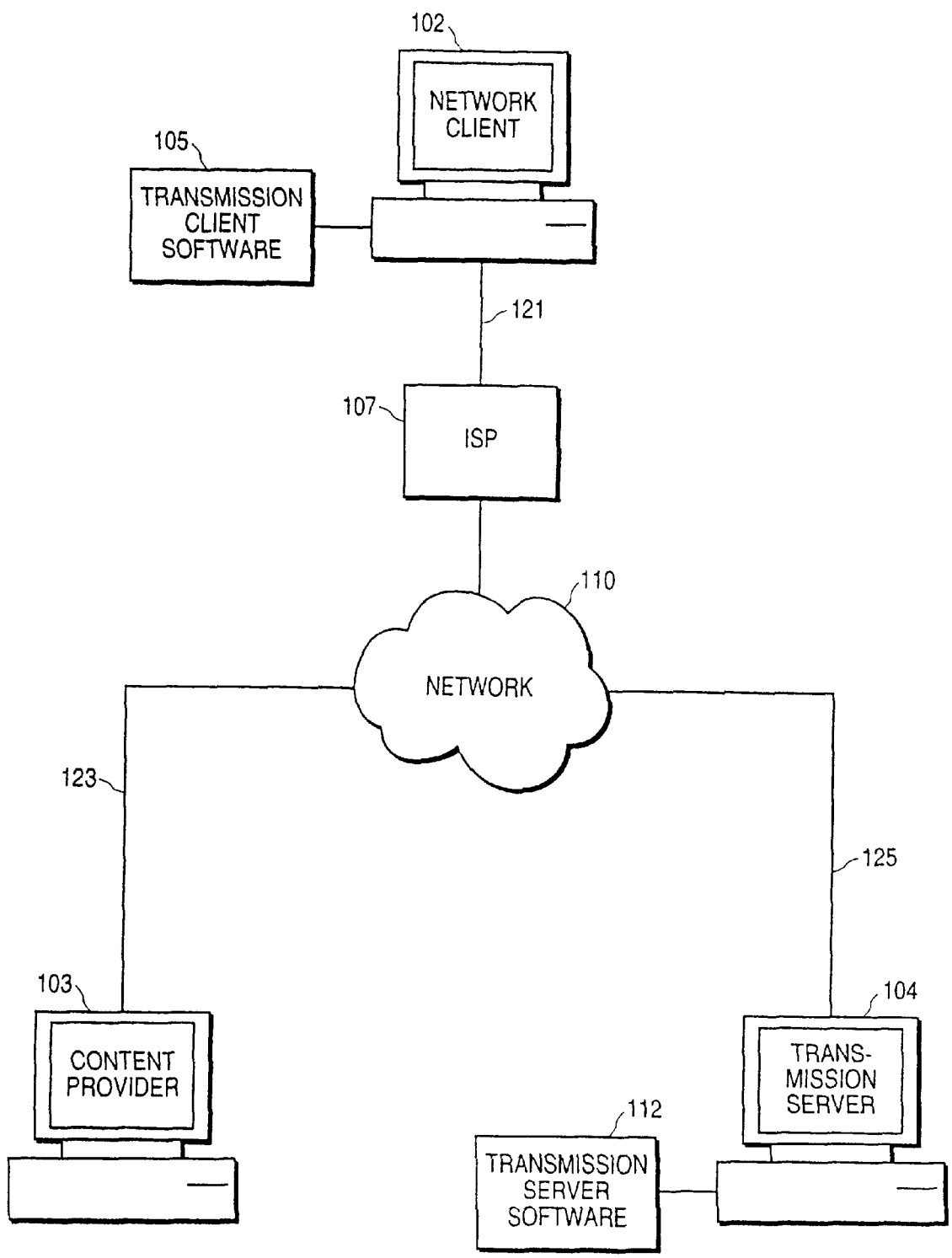
FIG. 1A is a block diagram of a computer system that implements one or more embodiments of the present invention.

FIG. 1A illustrates a computer network system that implements one or more embodiments of the present invention. In FIG. 1A, a network client computer 102 is coupled, directly or indirectly, to one or more other computers through a network 110. The other computers may include various other client or server computers that provide content over the network. Network 110 may be the Internet, a Wide Area Network (WAN), a Local Area Network (LAN), or any combination thereof.

For the embodiment in which network 110 is the Internet, the content provider computer 103 is typically a World-Wide Web (WWW) server that stores data in the form of 'web pages' and transmits these pages as Hypertext Markup Language (HTML) files over the Internet network 110 to various computers such as client computer 102. For this embodiment, the client computer 102 runs a "web browser" program to access the web pages served by content provider computer 103. Network client 102 connects to the Internet through an Internet Service Provider (ISP) 107 or similar system that provides access to the Internet. The network client 102 is coupled to the ISP 107 through a network interface device (e.g., a modem) over a signal line, such as a telephone land line, tiber optic line, or similar line. Similarly, the content provider computer 103 is coupled to the network 110 over line 123 that may be a telephone line, fiber optic line, cable, T1 line, or a similar line. For the Internet implementation of FIG. 1A, communication between the client computer 102 and the content provider computer 103 uses the TCP/IP (Transmission Control Protocol/Internet Protocol) system.

The speed of the data transmissions between the client computer 102 and the content provider 103 depend upon the performance characteristics of the network interface devices in the computers and the bandwidth characteristics of the transmission media, as well as the traffic on the network. In one embodiment of the present invention, a transmission server 104 executes software that increases the data transfer rate between client and server computers over the network. For the embodiment illustrated in FIG. 1A, transmission server 104 is a server computer that executes a transmission server program 112. A client version of the transmission program 105 is executed on the client computer 102 to work in conjunction with the transmission server program. The client and server transmission programs may represent one or more executable program modules that are stored within the respective computers and executed locally. Alternatively, however, the transmission programs may be stored on remote storage or processing devices coupled to the respective computers and accessed remotely to be locally executed.

It should be noted that a network system 100 that implements embodiments of the present invention may include a larger number of interconnected client and server computers than shown in FIG. 1A. Furthermore, one or more of the computers illustrated in FIG. 1A may be coupled to network 110 through routers that serve to buffer and route the data transmitted between the computers and the network.

Figure 1B:
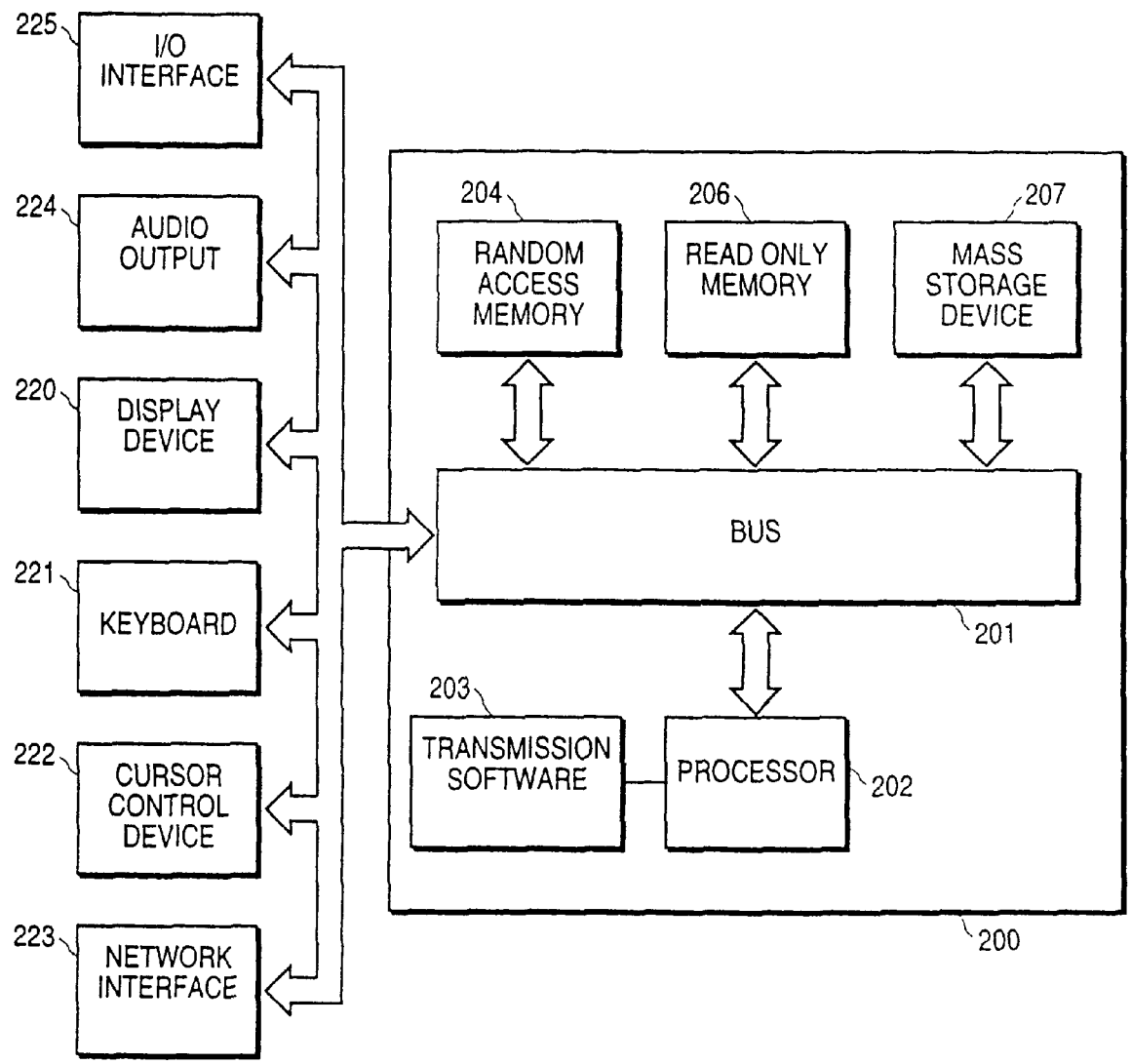
FIG. 1B is a block diagram of a representative computer that executes one or more program routines that embody aspects of the present invention.

As can be appreciated by those of ordinary skill in the art, the representative networked computers of FIG. 1A, such as transmission server computer 104 can be implemented as any standard computer that includes a CPU coupled through a bus to other various devices. FIG. 1B is a block diagram of a representative networked computer, such as network server computer 104 illustrated in FIG. 1A. The computer system 200 includes a processor 202 coupled through a bus 201 to a random access memory (RAM) 204, a read only memory (ROM) 206, and a mass storage device 207. Mass storage device 207 could be a magnetic disk, optical compact disk, or tape drive for storing data and instructions. A display device 220 for providing visual output is also coupled to processor 202 through bus 201. Keyboard 221 and cursor control unit 222 are coupled to bus 201 for communicating user commands to processor 202.

Also coupled to processor 202 through bus 201 are additional ports, such as audio output port 224, an input/output (I/O) interface 225, and a network interface device 223. Network interface device 223 provides a physical and logical connection between computer system 200 and a network. It is used by various communication applications running on computer 200 for communicating over the network medium, and may represent devices such as an Ethernet card, ISDN card, modem, or similar devices. It should be noted that the architecture of FIG. 1B is provided primarily for purposes of illustration, and that a server or client computer used in conjunction with the present invention is not limited to the specific architecture shown.

In one embodiment of the present invention, processor 202 within computer system 200 executes one or more software routines that comprise a data transmission software process 203 that is implemented by a server or client computer, such as server 104 or client 102 in FIG. 1A. It should be noted that any of the computers in FIG. 1A could be implemented in the form of personal computers, laptop computers, mainframe computers, or other type of workstation computers.

As stated above, for the embodiment of the network architecture illustrated in FIG. 1A, content provider 103 is a network server computer that stores data and executes programs that provide web pages in the form of HTML, XML (Extensible Markup Language), or similarly coded, documents over network 110. Client computer 102 executes a web browser program that allows a user to access and view web pages provided by content provider 103. During a typical web browsing operation, a user on client computer 102 accesses a web page served by content provider 103 by typing or entering the URL corresponding to the content provider web site in the address field of his or her web browser.

Figure 2:
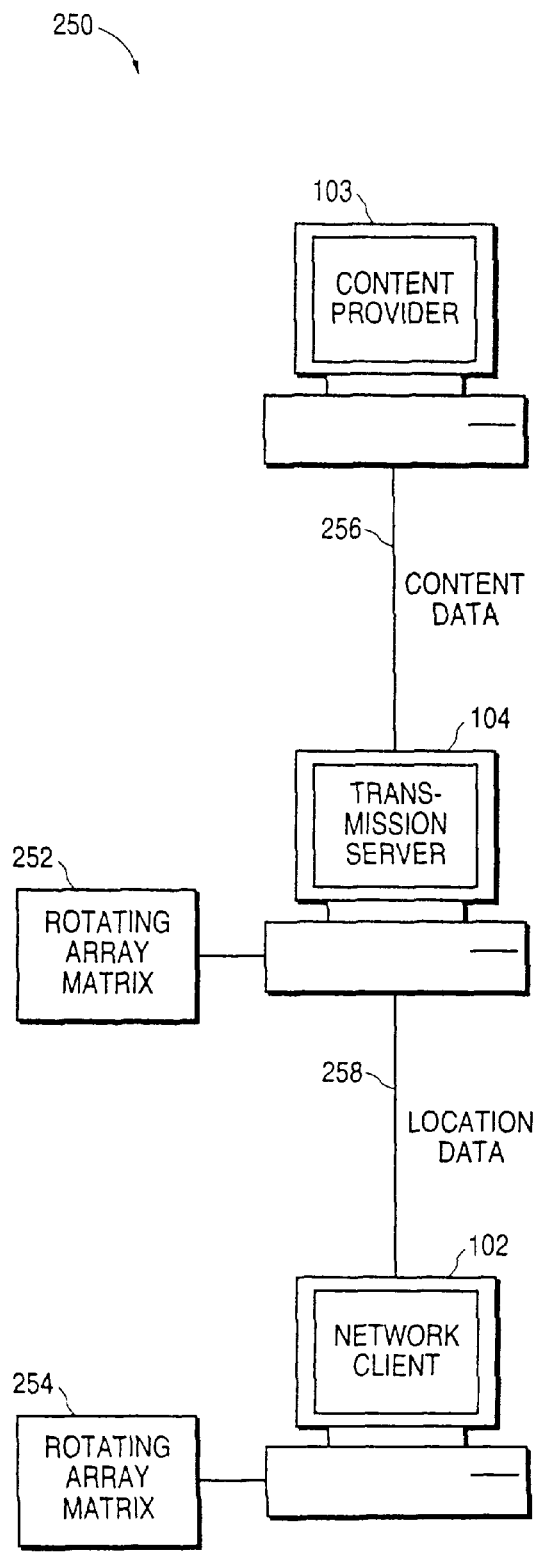
FIG. 2 illustrates a virtual model of the transmission between the transmission server and client and content server computers, according to one embodiment of the present invention.

In one embodiment of the present invention, transmission server 104 intercepts all data transmission requests between the client computer 102 and the content provider 103. FIG. 2 illustrates a virtual model of the transmission between the transmission server and client and content server computers, according to one embodiment of the present invention. The client computer includes DLL (Data Link Layer) drivers that run as background processes of the operating system. These drivers communicate at the IP layer with the transmission server software running on the transmission server computer. This causes the IP routing to be directed to the transmission server computer regardless of the URL entered into the web browser program of the client computer. The DNS (domain name service) router for the client computer is programmed to return the IP address of the transmission server computer in response to IP addresses generated by the client computer. This essentially forces a DNS entry, and in this manner, the IP routing of the client computer is effectively intercepted and re-routed to the transmission server.

For the embodiment illustrated in FIG. 2, the user first logs onto the transmission server over the Internet. At this point, communication between the client computer and other computers on the Internet occur through the transmission server. The transmission server may also include various databases and processes that provide subscription-level services to validate users of the transmission server. For example, when IP traffic from a client computer is routed to the transmission server, the transmission server can verify the IP address and proprietary Electronic Serial Number (ESN) of the software of the client computer as a valid subscriber or user of the system, prior to passing the data transmission request on to the target network server computer (content provider).

During normal operation, the transmission server effectively acts as a proxy server that serves data or web pages to the client computer regardless of the server targeted by the client computer. In one embodiment of the present invention, the transmission server may also include a proxy server process that proxies the data transmitted to the client computer. In general, a proxy server is a machine or server process that stores recently accessed data, such as web pages that have been accessed within a specified period of time. As such, proxy servers generally serve as cache memory for recently accessed documents or web pages. Pages are stored in the proxy server for a certain period of time, after which they are automatically deleted or overwritten. For most Internet applications, proxy servers can be configured to download requested pages if the page has expired or is not otherwise presently stored in the proxy server.

In one embodiment of the present invention, the transmission server 104 executes a rotating array matrix process 252 that serves to convert data transmitted to and from the client computer 102 into location data to effectively compress the data. For the embodiment illustrated in FIG. 2, the network computer likewise executes a rotating array matrix process 254. The respective client and server rotating array matrix processes comprise elements of the transmission client software 105 and transmission server software 112 process illustrated in FIG. 1.

The rotating array matrix process is essentially a multiple algorithmic virtual table propagated through binary pattern transmission utilizing vector coordinates within a hyperbola model, that may be otherwise referred to as the "[x,y] dimensional rotating array matrix". A virtual table is one that has a list, is built quickly, and that may be modified as circumstances dictate. The virtual tables are generated and stored on both the sending and receiving computers. Depending on the direction of the data transmission, either the client or server computer can be a sending or receiving computer.

For example, if a web page request is made from a client computer, the client is the sending (encoding) computer and the transmission server is the receiving (decoding) computer. Likewise, when the contents of the web page are provided by the content provider through the transmission server to the client computer, the transmission server is the sending computer and the client is the receiving computer.

The transmission client/server software increases the data throughput speed and efficiency between the client computer and the network. The IP layer packet data is transmitting using standard Internet Protocol, however between the client computer and the transmission server, the data is sent as location indices that indicate the location of data, rather than the data itself. The data is provided in dynamic tables that are generated and constantly cycled in the memories of the client and server computers. The location of the data in the tables is transmitted to the client computer. Using the location data, the client computer reconstructs the actual data. In this manner, the amount of data transmitted between the client computer and the network is greatly decreased, thus resulting in an increase in the speed and efficiency of data transfers.

In one embodiment of the present invention, a dynamic data table in the form of a two dimensional array of binary data is stored in the random access memory of the transmission server computer. The binary pattern comprising the table represents all of the patterns that can be transmitted between the client computer and the network. Such a pattern can be generated using the squared-repeat phenomenon, which is a mathematical equation that generates all of the possible characters or patterns that can be generated by a system by squaring a subset of these characters or patterns. For example, in the decimal number system, squaring the value 111,111,111 yields the number 12345678987654321. Thus, all of the numbers in the base 10 system can be created by mathematically manipulating the number 1.

This technique is used to generate all of the possible patterns that can be generated in the binary number system. The dynamic table within the transmission server computer is then programmed to contain this pattern of bits. Thus, if the computer is a 16-bit computer, the dynamic table includes all the different combination of 16 bits. Because of limited memory resources, and in order to minimize memory requirements, the binary patterns are cycled through the table. The table is updated once every processor cycle (or "tick"). For the case in which the processor cycles 60 times in one second, the table is updated at this frequency. Pre-determined blocks of bits are shifted through the table during each tick. The dynamic table comprises the rotating array matrix illustrated in FIG. 3.

For purposes of illustration, the data table is represented as a cube with six faces. This representation allows the pattern of bits (or matrix) to be viewed as an array that "rotates" in space as the blocks of bits are updated. For this representation, each face of the cube contains a number of bits in a particular pattern. Each pattern on a face represents a block of bits that are shifted through the table during each tick. Again, because the bit pattern on the cube changes with time, the cube represents a rotating array matrix.

Figure 3:
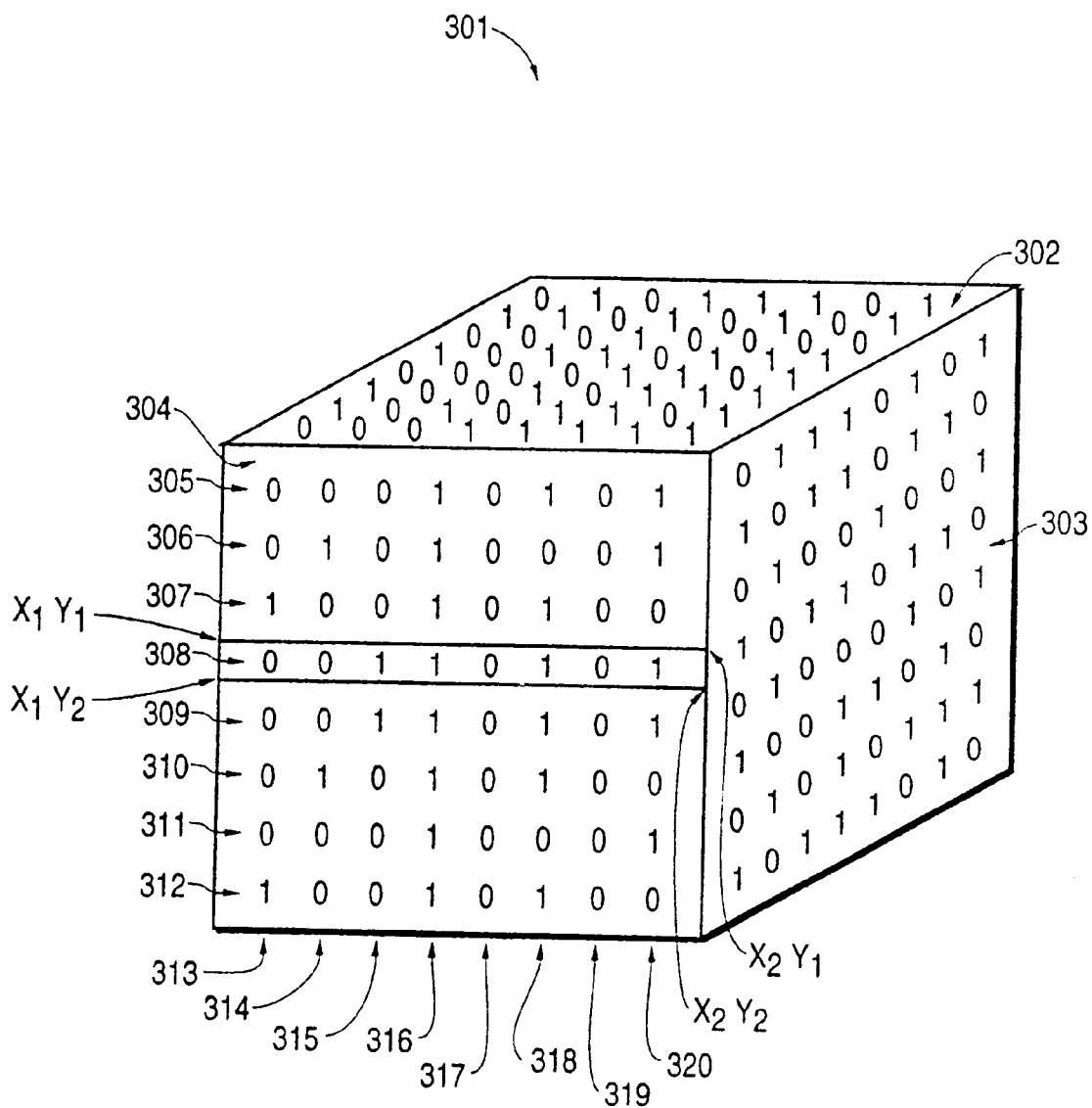
FIG. 3 illustrates a rotating array matrix in the form of a cube, according to one embodiment of the present invention.

FIG. 3 illustrates a rotating array matrix in the form of a cube, according to one embodiment of the present invention. Rotating array matrix 301 is a cube with three visible faces, 302, 303, and 304. Face 304 is considered the "active" face and contains the bit pattern for which a data match is performed. The pattern of bits on each face shift to another face of the cube during each tick. Thus, the pattern contained in face 304 are shifted to another face of the cube for the next tick of the processor. For example, the pattern in face 304 may be moved to face 302, and the pattern in face 302 moved to face 303 during the next tick. In this manner, the cube represents a rotating matrix of numbers that correspond to blocks of numbers in memory being shifted through memory during each processor cycle.

Each face in cube 301 of FIG. 3 contains an 8 by 8 matrix of bits. Face 304 comprises eight rows of bits 305 to 312 and eight column of bits 313 to 320. The five other faces of cube 301 contain similar arrangements of bits. Each face contains a pseudo-random array of bits within which a valid bit pattern may be contained. The target bit patterns are contained within either a row or column of a face. For example, in cube 301, row 308 may contain a target bit pattern. Each row or column on the active face of the cube is referenced by x-y location variables, also referred to as "axis" variables. For the two-dimensional arrays contained in an active face, the axis variables are denoted $X_1$, $X_2$, $Y_1$, and $Y_2$. Pairs of axis variables define the corner points of the row and columns. Thus, the location of row 308 is represented by the axis variable pairs, $X_1Y_1$, $X_2Y_1$, $X_1Y_2$, and $X_2Y_2$, as shown in FIG. 3. These axis variable pairs comprise the location data that is transmitted to the decoding computer for valid data that is contained within that row or column of the active cube face.

For each processor tick, an entire face of the cube is shifted to another face of the cube. For the 8 by 8 matrix of cube 301, a shift of nine bits is required to completely shift the faces of the cube. For binary data, the logarithmic operation is performed on each face to shift the block of bits for each tick. Thus, face A at time $T_2$ is equal to the logarithm of face A at time $T_1$, where $T_2$ is one tick subsequent to $T_1$.

It should be noted that although cube 301 in FIG. 3 was illustrated as a cube 8 bits wide by 8 bits high by 8 bits deep, various dimensions are possible depending upon the size of memory and data paths (processor and bus size) in the transmission server computer.

Figure 4:
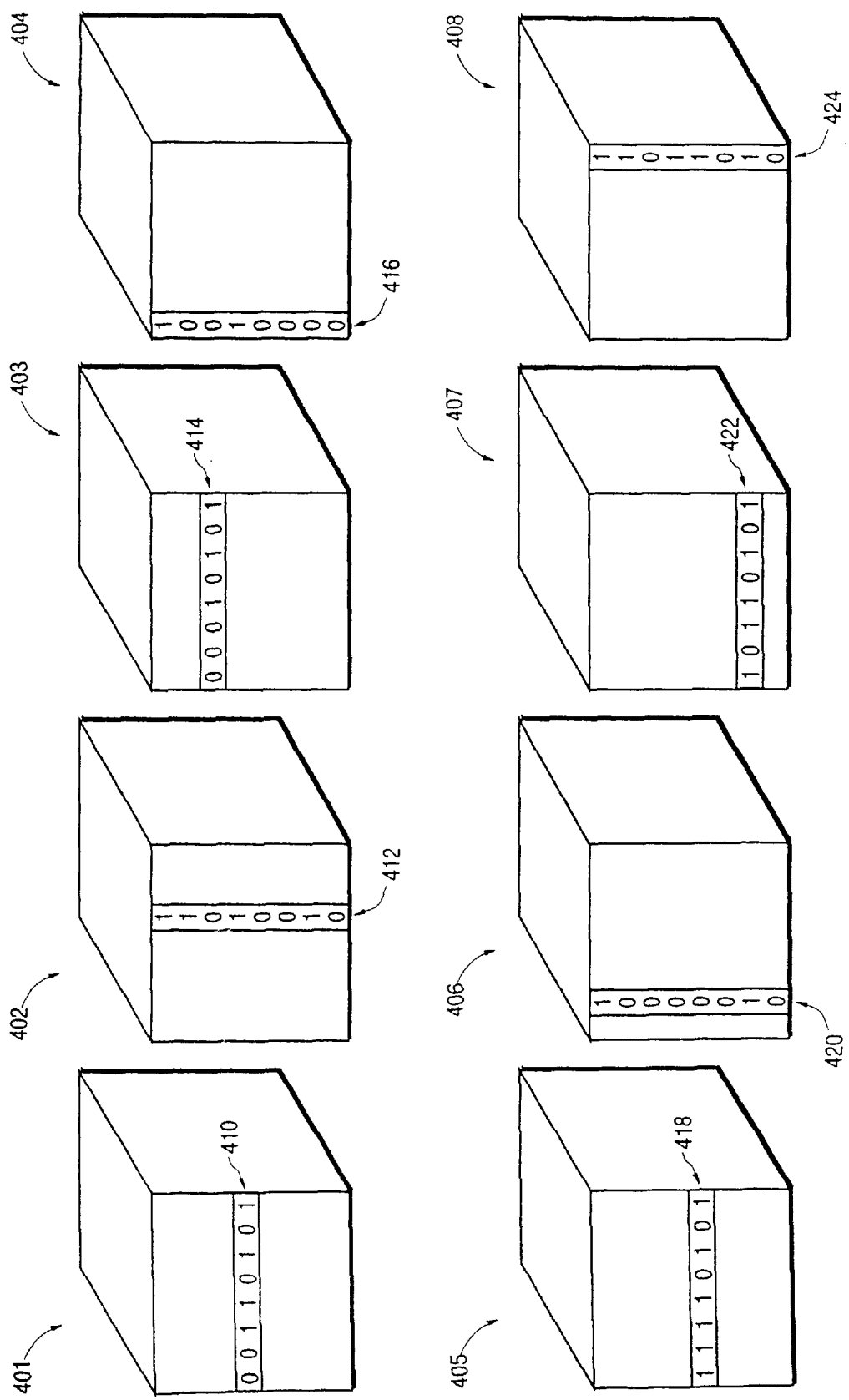
FIG. 4 illustrates an array of eight 8-bit rotating matrices within the memory of a transmission server computer, according to one embodiment of the present invention.

Depending upon the size of memory within the computer, there may be several dynamic tables (cubes) generated for each processor cycle. For example, a computer with 64 Mbytes of available RAM would be able to accommodate eight 8-bit cubes in memory. FIG. 4 illustrates an array of eight 8-bit rotating matrices within the memory of a transmission server computer, according to one embodiment of the present invention. At a particular time (processor period) the eight rotating array matrices represented by cubes 401 to 408 are present within the memory of the transmission server computer. For clarity of illustration, the pattern of bits on each face of each cube 401 through 408 are not shown, however it will be appreciated that each cube in FIG. 4 resembles cube 301 in FIG. 3.

Each active face of the cubes 401 to 408 contains an array of bit patterns that may correspond to valid data sets. Each data set is referenced by location data comprising the x-y axis variables as illustrated in FIG. 3. Thus, in FIG. 4, cube 401 contains data set 410, cube 402 contains data set 412, cube 403 contains data set 414, cube 404 contains data set 416, cube 405 contains data set 418, cube 406 contains data set 420, cube 407. contains data set 422, and cube 408 contains data set 424.

In FIG. 4, each data set is an 8-bit byte that may represent a text character or data string portion that is to be transmitted to a client computer. However, instead of transmitting the actual 8-bit data sets to the client computer, the x-y axis variables are transmitted instead. Thus, if eight 8-bit bytes are to be transmitted to the client computer (as illustrated in FIG. 4), eight sets of axis variables are sent instead. This results in a data compression factor of 32. The $X_1$, $Y_1$, $X_2$, $Y_2$ axis variables for all eight cubes equals 32 bits of data. Each data set location or slope in FIG. 4 is 1024 bits. The throughput by sending only the location data is thus increased by a factor of 32 (1032 divided by 32) for each data set.

Although the data sets illustrated in FIG. 4 are represented as being contained in either a row or column of a rotating array matrix, it should be noted that such data sets could also be contained in other patterns on the face of a cube. For example, a data set could be contained within a diagonal set of bits on the face of a cube. Such a data set could be provided for a transmission server computer and/or client computer that implements dynamic memory. For dynamic memory, the incrementing scheme for successive memory locations is variable, rather than fixed. Thus, the location of successive bits in a data set could vary rather than increase by a fixed value.

In one embodiment of the present invention, an identical copy (clone) of the rotating array matrix of the sending computer is maintained in the memory of the receiving computer (e.g., the client computer). The receiving computer's rotating array matrix in the receiving computer is rotated synchronously with the rotating array matrix in the sending computer. The receiving computer's rotating array matrix may be synchronized to a clock signal generated by the sending computer. This ensures the synchronization between the rotating array matrices. Because of propagation delays form transmitting the clock signal over the network, there may be some latency associated with this synchronization scheme. However, the timing of the processor cycles that generate the ticks can be altered to accommodate a worst-case synchronization latency. Alternatively, the rotating array matrices in both the sending and receiving computers can be synchronized to an external clock, such as a network clock, satellite GPS UT (Universal Time) clock, or a similar time reference.

Figure 5:
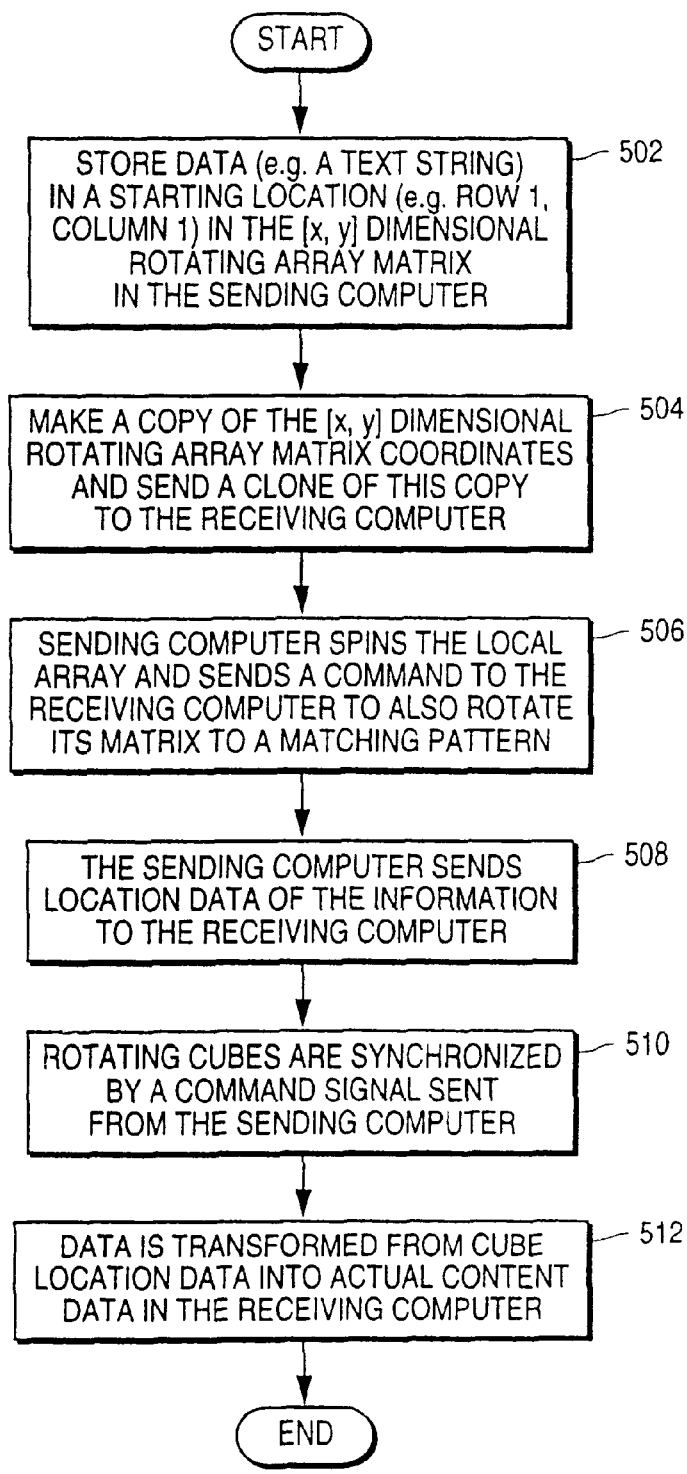
FIG. 5 is a flowchart that illustrates a method of transmitting data between a transmission server computer and a client computer, according to one embodiment of the present invention.

FIG. 5 is a flowchart that illustrates a method of transmitting data between a sending computer (e.g., a transmission server computer) and a receiving computer (e.g., a client computer), according to one embodiment of the present invention. In step 502, data to be transmitted (e.g., a text string or sentence) is stored in a first location of a rotating array matrix in the memory of the sending computer. A copy of the rotating array matrix is transmitted to the receiving computer. This produces a clone of the rotating array matrix in the client computer, step 504. At this point, both the sending and receiving computers have identical copies of the rotating array matrix.

The sending computer spins the rotating array matrix in its memory to find the data pattern corresponding to the data to be sent to the receiving computer and sends a command to the receiving computer to also spin its matrix to find the matching pattern, step 506. The sending computer then sends the location data (axis variables) of the data to be transmitted to the receiving computer, step 508.

In step 510, the rotating arrays are synchronized by a command sent by the sending computer to the receiving computer. Such a command could be a command to set the matrix back to it a default initial position so that the sending computer is in the initial position, and the receiving machine is in the same initial position. In the receiving computer, the data is transformed from the location information into the actual data, step 512.

Figure 6:
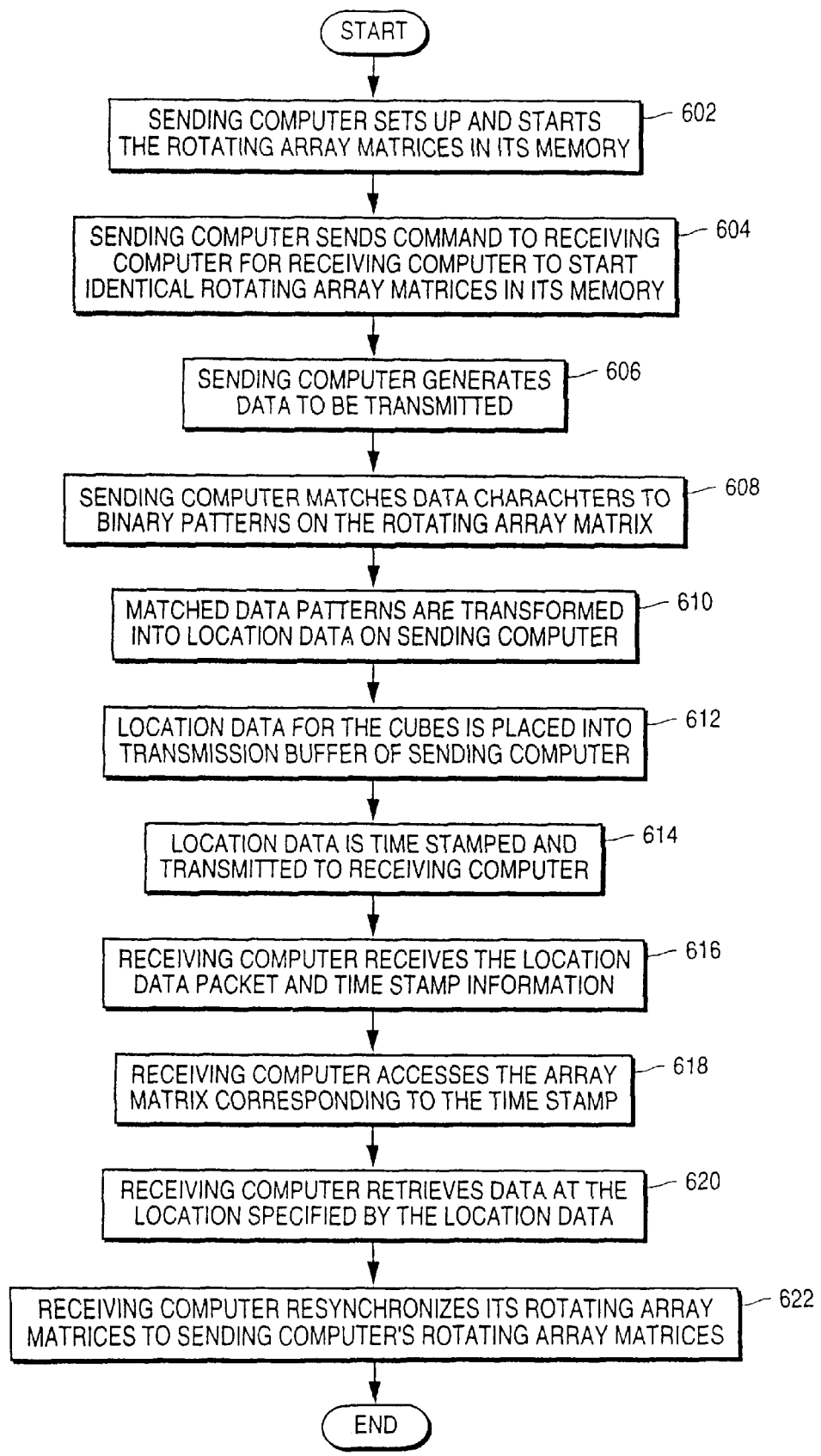
FIG. 6 is a flowchart that illustrates the method of transmitting data between a sending and receiving computer using associated rotating array matrices, according to one embodiment of the present invention.

FIG. 6 is a flowchart that illustrates the method of transmitting data between a sending and receiving computer using associated rotating array matrices, according to one embodiment of the present invention. In step 602 the server computer starts the rotating array matrices (dynamic cubes) cycling through the data patterns. The server computer then sends a command to the client computer to start identical rotating array matrices cycling in its memory, step 604. At this point, each of the cubes within the rotating array matrices are cycling through identical patterns of binary data, until data to be transmitted is processed by the sending computer. Note that the sending computer could be either the client or the server computer, depending upon the direction of data flow. For purposes of discussion with respect to FIG. 6, it is assumed that the server computer is the sending computer.

In step 606, the server computer (sending computer) generates the data to be transmitted. Such data could be data that is entered by a user, generated internally in the server computer, or data that is received over the network for transmission to the client computer (receiving computer). The server computer parses the binary characters (typically, bytes) comprising the data packets to be sent, and matches the binary characters on the rotating array matrices, step 608. For example, if the character string "www.cnn.com" is being transmitted from the server to the client, the server searches for the binary patterns corresponding to this text string on each of the cubes. The number of characters that may be present on a cube depends on the size of each cube. For example, with reference to FIG. 4, eight bytes of the character string, that is, "www.cnn." may be found on cube 401, and the remaining bytes of the string ".com" may be found on cube 402. If this string comprises the entire packet to be sent, the remaining cubes 403 to 408 are padded with null values.

For each cube, the data that is found corresponding to the transmitted data is transformed into location data using the x-y axis variables, step 610. In this manner, for the example above, 8 bytes of data is transformed into 8-bits of data to be transmitted to the client computer. The location data for all the cubes for the packet of data is then placed into a transmission buffer of the server computer, step 612. A time stamp is associated with the packet to be sent, and then the packet comprising the location data is transmitted to the client computer over the network. In general, the size of the location data gathered in the transmission buffer corresponds to the standard packet of the network. For example, for the Internet the standard packet size is 8 bytes.

In step 616, the receiving computer receives the location data packet and the time stamp information from the sending computer. The receiving computer then uses the location data and time stamp data to recreate or "unwrap" the data. The receiving computer recreates, essentially spins back, the array matrix corresponding to the time stamp, step 618. In some cases, this might entail going back several ticks. The receiving computer then retrieves the data at the specified x-y location on the array matrix corresponding to that time stamp and reads out the data pattern at that location, step 620. Typically, the receiving computer will need to go back in time relative to the sending computer to find a pattern match on its rotating array matrices. In step 622, the receiving computer resynchronizes its rotating array matrices with those of the sending computer. For example, if the receiving computer went back 8 ticks to find the appropriate array matrix, it must go forward at least 8 ticks at once to resynchronize with the sending computer. The resynchronization process must also take into account the amount of time it takes to recreate the data. Thus, if two ticks are required to recreate the data, the receiving computer would need to go forward ten ticks to resynchronize with the sending computer.

In an alternative embodiment of the present invention, an encode/decode process is provided between the transmission server and the client computer. For this embodiment a second table is provided. This table is static and does not change with respect to time. This table is implemented as a DLL level program that encodes the data prior to its being transmitted to the transmission software. Such a encode/decode program could be implemented for different types of data, such as text, voice data, graphic data, or any other kind of data that is capable of being represented and transmitted as binary data. The size and type of encoding table depends upon the data that is being encoded and transmitted.

Figure 7:
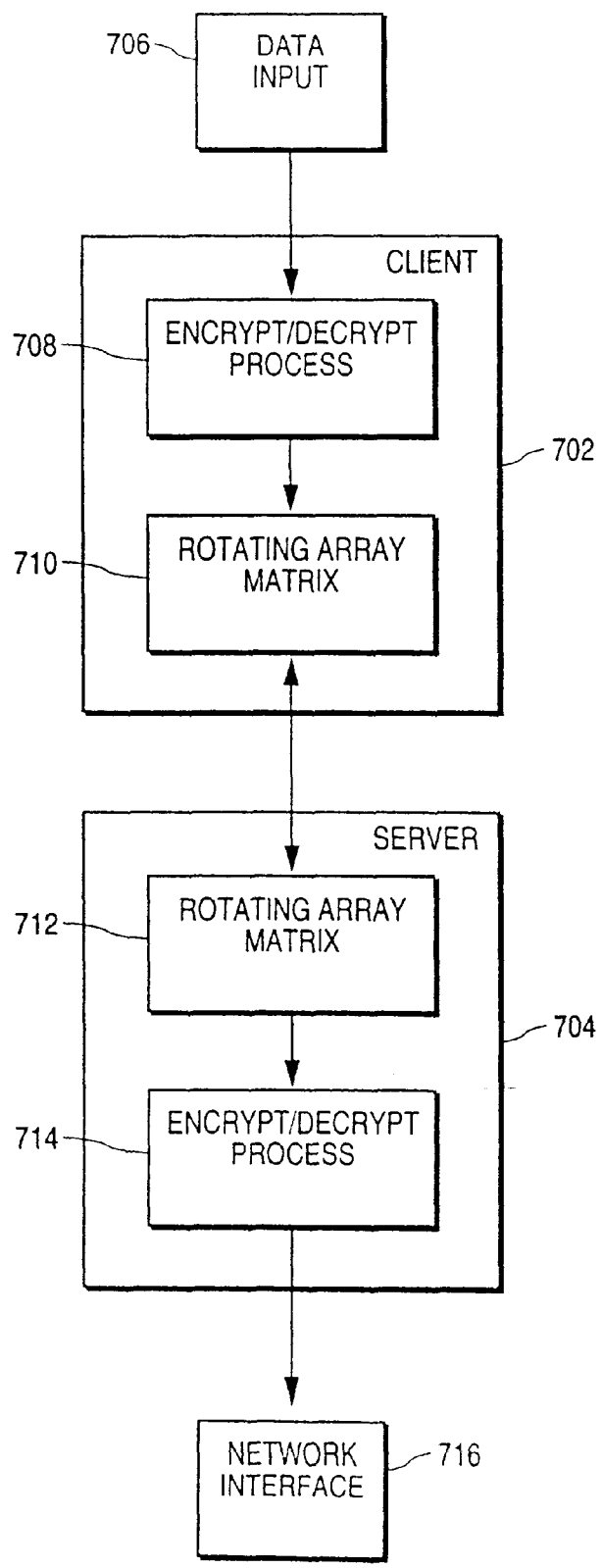
FIG. 7 is a block diagram of a rotating array matrix transmission system that incorporates encode/decode processes, according to one embodiment of the present invention.

FIG. 7 is a block diagram of a rotating array matrix transmission system that incorporates encode/decode processes, according to one embodiment of the present invention. In FIG. 7, the client computer executes an encode/decode process 708 that accepts input from a data input device 706. For data that is input into client 702, the data is first encoded prior to processing through the rotating array matrix software 710. Likewise, the server computer 704 executes an encode/decode process 714 that encodes or decodes data transmitted to server 704 through network interface device 716 after it has been processed by the rotating array matrix software 712.

In one embodiment of the present invention, the transmission client/server software is implemented in a network that utilizes point to point telephony infrastructure. It is to be noted, however, that alternative embodiments can be implemented for use with point to point video conferencing or point to multi-point homing, or similar network systems.

Although some of the Figures and associated description are largely directed to embodiments that utilize technology that is specific to the Internet and the World Wide Web, it should be noted that embodiments of the present invention can also be used in the context of other networked computer systems, such as local area networks, wide area networks, and other proprietary networks.

In the foregoing, a system has been described for increasing the throughput of terrestrial digital network transmission. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method of transmitting data from a first computer to a second computer over a network, comprising the steps of:

generating a first data array in the memory of the first computer, the first data array comprising a set of possible binary patterns generated by the first computer;

generating a second data array in the memory of the first computer, the second data array synchronized to the first data array at a first time;

matching a data string to be transmitted from the first computer to the second computer to a corresponding data set on the first data array;

generating location information relating to the location of the data string in the first data array, and transmitting the location information and transmission time information to the second computer.

2. The method of claim 1, further comprising the steps of:

receiving the location information and time information in the second computer;

recreating the first data array instance in the second data array corresponding to the transmission time information;

accessing the data string in the second data array using the location information corresponding to the first data array instance.

3. The method of claim 3 further comprising the step of periodically altering the binary patterns contained in the first table and second table.

4. The method of claim 4 wherein binary patterns contained in the first table and second table are altered by moving a block of binary digits from a first memory location to a second memory location.

* * * * *